United States Patent
Sameshima

(10) Patent No.: US 6,656,747 B2
(45) Date of Patent: Dec. 2, 2003

(54) FERROELECTRIC MEMORY AND METHOD FOR MANUFACTURING SAME

(75) Inventor: Katsumi Sameshima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/929,187

(22) Filed: Aug. 14, 2001

(65) Prior Publication Data

US 2002/0005532 A1 Jan. 17, 2002

Related U.S. Application Data

(62) Division of application No. 09/451,979, filed on Nov. 30, 1999.

(30) Foreign Application Priority Data

Dec. 1, 1998 (JP) .......................................... 10-341326

(51) Int. Cl.⁷ .............................................. H01L 21/00
(52) U.S. Cl. ..................... 438/3; 438/240; 438/250; 438/393; 257/295
(58) Field of Search .............................. 257/295; 438/3, 438/240, 250, 393; 427/79, 123, 125, 126.5

(56) References Cited

U.S. PATENT DOCUMENTS

| | | | |
|---|---|---|---|
| 5,561,307 A | * | 10/1996 | Mihara et al. ............... 257/295 |
| 5,652,446 A | | 7/1997 | Sakao |
| 5,767,541 A | * | 6/1998 | Hanagasaki ................. 257/295 |
| 5,801,916 A | | 9/1998 | New |
| 5,834,348 A | * | 11/1998 | Kown et al. ................. 438/240 |

FOREIGN PATENT DOCUMENTS

| | | |
|---|---|---|
| EP | 0697719 | 2/1996 |
| EP | 0886317 | 12/1998 |
| JP | 05-327062 | 12/1993 |
| JP | 11-251549 | 9/1999 |

* cited by examiner

*Primary Examiner*—Long Pham
*Assistant Examiner*—Wai-Sing Louie
(74) *Attorney, Agent, or Firm*—Gerald T. Bodner

(57) ABSTRACT

Ferroelectric memory includes a hollow formed in a first insulation film. A lower electrode is formed in this hollow by sol-gel method including an application process due to a spin coat method. In this application process, a precursor solution is dripped on a surface of the first insulation film and splashed away due to centrifugal force. Due to this, a first conductive film to being formed has an increased film thickness at portion of the hollow where the precursor solution is ready to correct, or portion to be formed into a lower electrode, and a decreased film thickness at portion other than the hollow. Accordingly, it is satisfactory to etch only the hollow portion when forming a lower electrode by dry-etching the first conductive film.

8 Claims, 8 Drawing Sheets

D
C
B
A (A)

(B)

(C)

(D)

(E)

(A)

(B)

(C)

(D)

(A)

(B)

(A)

(B)

FERROELECTRIC MEMORY AND METHOD FOR MANUFACTURING SAME

CROSS REFERENCE TO RELATED APPLICATION

This application is a divisional application of co-pending U.S. application Ser. No. 09/451,979, filed on Nov. 30, 1999.

BACKGROUND OF THE INVENTION

1. Field of the Invention

This invention relates generally to a ferroelectric memory and method for manufacturing same and, more particularly, to a ferroelectric memory with a structure formed, on an insulation film, with a lower electrode, a ferroelectric and an upper electrode in this order, and a method for manufacturing such a ferroelectric memory.

2. Description of the Prior Art

The conventional ferroelectric memory 1 of this kind, shown in FIG. 13, includes a not-shown semiconductor substrate and a first insulation film 2 formed thereon. On the first insulation film 2, a lower electrode 3, a ferroelectric film 4 and an upper electrode 5 are formed in this order. Further, a second insulation film 6 is formed in a manner covering these films. To fabricate a ferroelectric memory 1, a conductive film 3a is formed of platinum (Pt) or the like by sputtering over the first insulation film 2 formed on the semiconductor substrate, as shown in FIG. 14(A). Then, a ferroelectric film 4a is formed of lead zirconate titanate (PZT) or the like on the conductive film 3a by a sol-gel process. A conductive film 5a is further formed by sputtering platinum (Pt) or the like over the ferroelectric film 4a. Then, as shown in FIG. 14(B) dry etching is conducted sequentially on the conductive film 5a, the ferroelectric film 4a and the conductive film 3a, thereby providing an upper electrode 5, a ferroelectric film 4 and a lower electrode 3. Thereafter, an insulation film 6 (FIG. 13) is formed in a manner covering these films by a CVD process.

In the prior art, however, a conductive film 5a, a ferroelectric film 4a and a conductive film 3a are formed to a thickness to provide an upper electrode 5, a ferroelectric film 4 and a lower electrode 3, so that dry etching is then conducted throughout a total film thickness in order to remove unwanted portions of these films, Thus, the prior art has required a much etch amount and hence a long etch time. This results in long-time exposure of the ferroelectric film 4 to the plasma atmosphere during a dry etch process. The plasma however has effects upon the ferroelectric 4 to lower its switching charge amount (Qsw). Thus, there has been a fear of causing such problem as worsening the symmetry in hysteresis and deteriorating the characteristics of coerciveness and fatigue.

SUMMARY OF THE INVENTION

It is therefore a primary object of the present invention to provide a ferroelectric memory having a ferroelectric characteristic that is free from deterioration, and a method for manufacturing same.

A ferroelectric memory according to the present invention, comprises: an insulation film; a hollow formed in a top surface of the insulation film; a lower electrode formed in the hollow; a ferroelectric formed on the lower electrode; and an upper electrode formed on the ferroelectric.

A manufacturing method according to the invention is a method for manufacturing a ferroelectric memory having a lower electrode, ferroelectric and upper electrode formed on an insulation film, characterized in that a hollow is formed in a surface of the insulation film and then a lower electrode is formed in the hollow by a process including an application process.

A hollow is formed in a top surface of an insulation film, and a lower electrode is formed in the hollow by a process including a spin coating method (e.g. sol-gel method). In a spin-application process, a precursor solution is dripped on the surface of the insulation film and splashed away by a centrifugal force. Consequently, the conductive film being formed has a thickness increased in a hollow portion that the precursor solution is ready to collect, i.e. a portion to be formed into a lower electrode, and decreased in other portion than the hollow. Accordingly, when etching the conductive film to form a lower electrode, it is satisfactory to etch only the portion other than the hollow, i.e. the thickness decreased portion of the conductive film, enabling etching in a brief time. However, where leaving the thinned portion of the conductive film for an interconnection, no etching is required. Also, if a first electrode portion is formed in a corner of the hollow by a process including a spin coating method and further a second electrode portion is formed thereon by a process including a spin coating method, a resulting lower electrode is reduced in amount of a depression caused in a top surface center. Meanwhile, if a first electrode portion is formed at a hollow corner by a process including a spin coating method and further a second electrode portion is formed thereon by sputtering, a resulting lower electrode is reduced in variation of crystalline orientation thereof. If a film is formed in a predetermined depth position with respect to a top surface of the insulation film to form a hollow in the insulation film by using this film as an etch stop, the hollow will have a flat bottom surface at the predetermined depth position. Further, the film blocks the water content of the insulation film from reaching the ferroelectric through the lower electrode. Furthermore, if the lower electrode in the hollow and the insulation film at their top surfaces are planarized flush with each other, there is no necessity to etch the conductive film at portions other than the hollow in the later process. If a thin film is formed on a planarized lower electrode by using a same material as the lower electrode, eliminated is surface roughening caused on the lower electrode upon planarization.

According to the invention, it is possible to shorten a time for which the dielectric is exposed to a plasma atmosphere during a dry etch process. Thus, the ferroelectric can be prevented from being deteriorated in characteristics by a plasma effect.

Also, the ferroelectric can be stabilized in crystallinity and orientation by forming a first electrode portion at a hollow corner and a second electrode portion thereon to provide a lower electrode or by forming a thin film on a planarized lower electrode.

Further, if a film is formed in the insulation film at a predetermined depth position with respect to a top surface thereof to form a hollow by utilizing the film as an etch stop, the hollow can be made flat in its bottom surface in the predetermined depth, making possible to stably form a lower electrode. Also, this film serves to block the moisture content of the insulation film from reaching the ferroelectric, thus preventing the ferroelectric from being deteriorated in characteristics.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
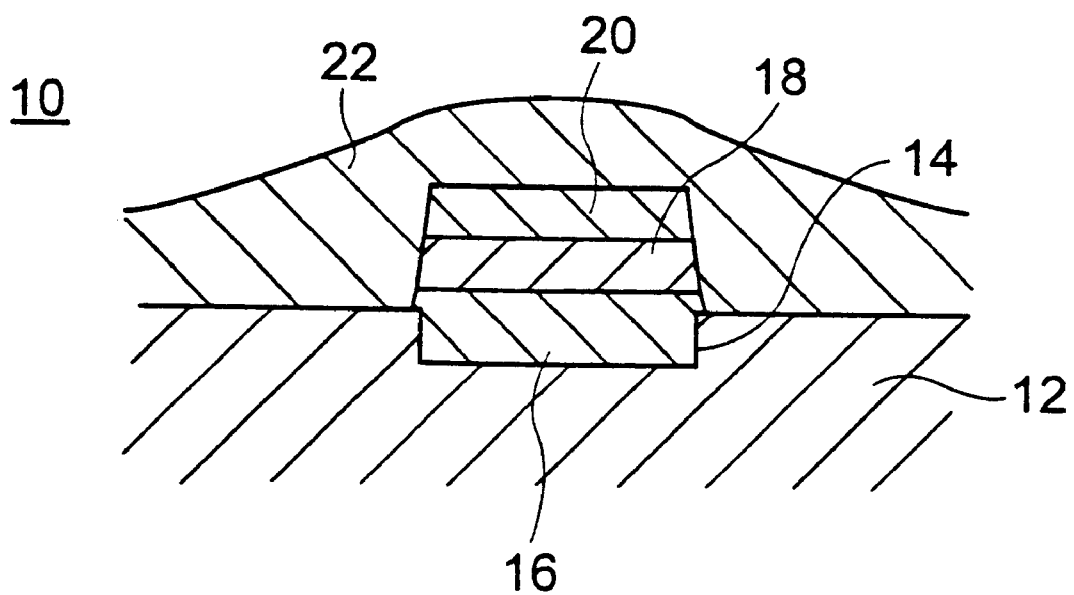
FIG. 1 is an illustrative view showing one embodiment of the present invention.

Referring to FIG. 1, there is depicted a ferroelectric memory 10 of this embodiment which includes a first insulation film 12 formed on a not-shown silicon (Si) substrate. The first insulation film 12 has a hollow 14 formed in its top surface to have a lower electrode 16 inside the hollow 14. A ferroelectric 18 and an upper electrode 20 are formed on the lower electrode 16 in this order. Further, a second insulation film 22 is formed covering these elements.

Figure 2:
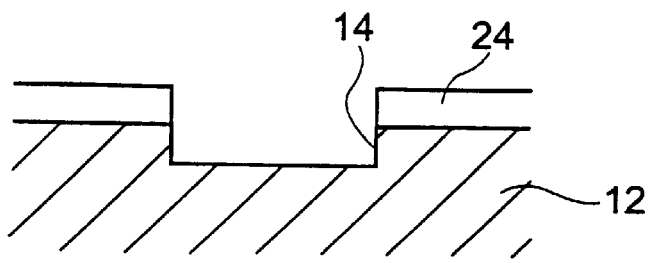
FIG. 2 is an illustrative view showing a method for manufacturing the FIG. 1 embodiment.
Figure 2:
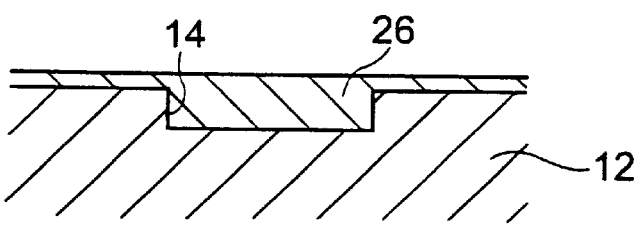
Figure 2:
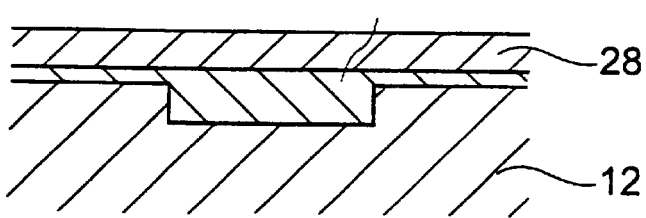
Figure 2:
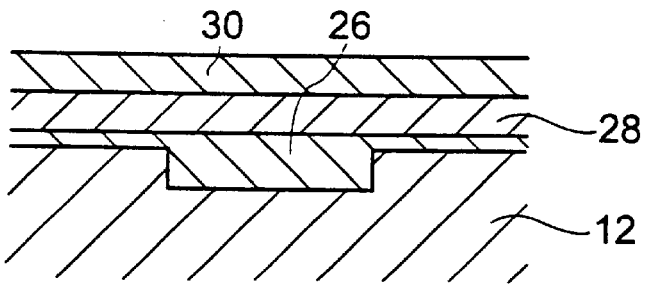
Figure 2:
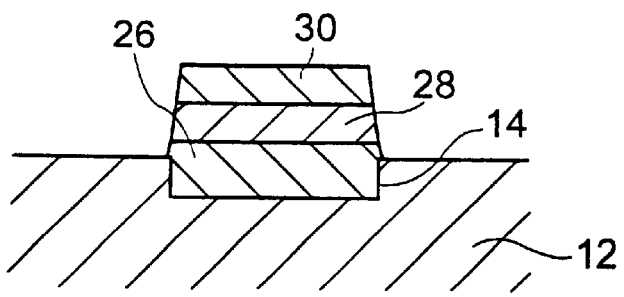

A method for manufacturing a ferroelectric memory 10 will now be explained concretely with reference to FIG. 2 and FIG. 3. First, a not-shown silicon (Si) substrate is prepared, to form thereon by a CVD technique a first insulation film 12 of silicate glass containing phosphorus (PSG), silicate glass containing boron/phosphorus (BPSG) or the like. Subsequently, as shown in FIG. 2(A) the first insulation film 12 is masked by a patterned resist 24 to form a hollow 14 by an RIE (reactive ion etching) technique as anisotropic dry etching. Then, as shown in FIG. 2(B) a first conductive film 26 as a gel dry film is formed by a sol-gel technique on a surface of the first insulation film 12 including an inside of the hollow 14. That is, an Ir precursor solution is formed by subjecting a metal alkoxide solution containing irridium (Ir) as an ingredient element to hydrolysis/polycondensation. This solution is applied onto a surface of the first insulation film 12 by a spin coating technique, and then dried into a gel dry film. In an application process using a spin coating technique, the precursor solution dripped on the surface of the first insulation film is splashed away due to a centrifugal force. However, the precursor solution existing inside the hollow 14 will not readily splashed away. This provides the first conductive film 26 with a film thickness that is greater at inside the hollow 14 than the other portion, as shown in FIG. 2(B).

Then, a film 28 for providing a ferroelectric 18 is formed over a surface of the first conductive film 26 by the sol-gel technique, as shown in FIG. 2(C). That is, a PZT (lead zirconate titanate) precursor solution is applied onto the surface of the first conductive film 26 by spin coating. The applied film is cured into a gel dry film. After forming the film 28, this structure overall is subjected to a heat process with utilizing RTA (Rapid Thermal Annealing) apparatus. The organic substances contained in the first conductive film 26 and film 28 are thermally decomposed and removed out of these films. Then, a second conductive film 30 is formed of platinum (Pt) over the film 28 by sputtering, as shown in FIG. 2(D).

Then, the second conductive film 30, the film 28 and the first conductive film 26 are sequentially etched (RIE technique) and removed of unwanted portions, as shown in FIG. 2(E). The etch process requires to etch a total film thickness of the second conductive film and the film 28, i.e. by an amount for a thickness of an upper electrode 20 and ferroelectric 18. Nevertheless, it is satisfactory for the first conductive film 26 to be etched only at areas extending out of the hollow 14. As described before, the portion extending out of the hollow 14 is smaller in thickness than a lower electrode 16. For this reason, an etch time is reduced as compared to the prior art requiring to etch the entire thickness of a lower electrode 16.

This structure is heat-processed using an RTA apparatus to bake and crystallize the first conductive film 26 and film 28. This provides a lower electrode 16 of irridium oxide ($IrO_2$) as well as a ferroelectric 18 of lead zirconate titanate (Pzt). In this embodiment, the second conductive film 30 on the film 28 is formed of platinum (Pt) with preferential orientation. Accordingly, the crystallization in the ferroelectric 18 occurs in an orientation similar to that of the second conductive film 30. That is, the ferroelectric 18 can be controlled in orientation depending upon the second conductive film 30. After forming a lower electrode 16, ferroelectric 18 and upper electrode 20 in this manner, a second insulation film 22 is formed of silicate glass containing phosphorus (PSG) or silicate glass containing boron/phosphorus covering these elements by CVD, as shown in FIG. 1.

According to the present embodiment, a hollow 14 was formed in the top surface of the insulation film 12 so that a lower electrode 16 can be formed inside the hollow 14 by the sol-gel technique including a spin-coating application process. As stated before, it is therefore possible to decrease an etch time to provide a lower electrode 16. This in turn reduces the time for which the film 28 for providing a ferroelectric 18 is exposed to a dry-etching plasma atmosphere. Thus, the ferroelectric 18 can be prevented from being deteriorated in characteristics by the affection of a plasma.

Figure 3:
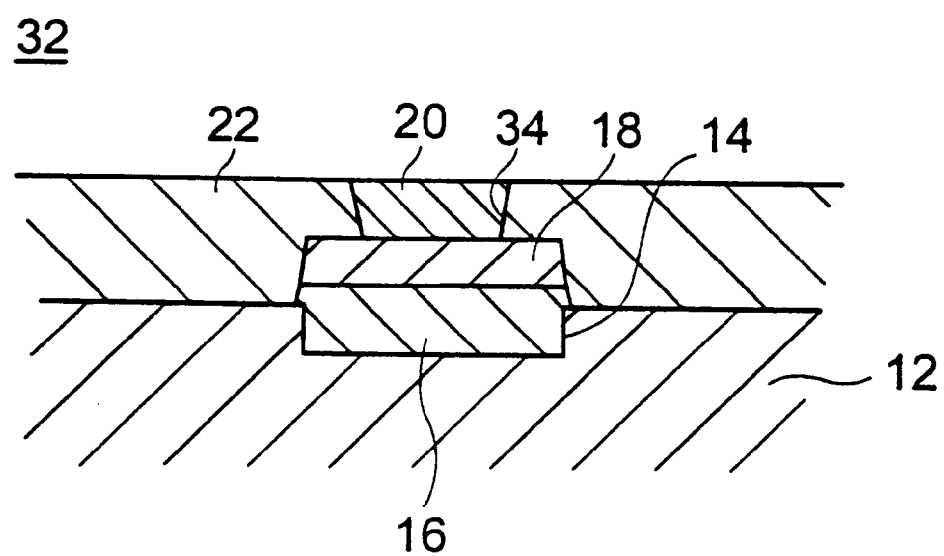
FIG. 3 is an illustrative view showing another embodiment of the present invention.

A ferroelectric memory 32 of another embodiment, shown in FIG. 3, has a hole 34 formed through a second insulation film 22 covering a lower electrode 16, a ferroelectric 18 and an upper electrode 20. The hole is buried with an upper electrode 20.

Figure 4:
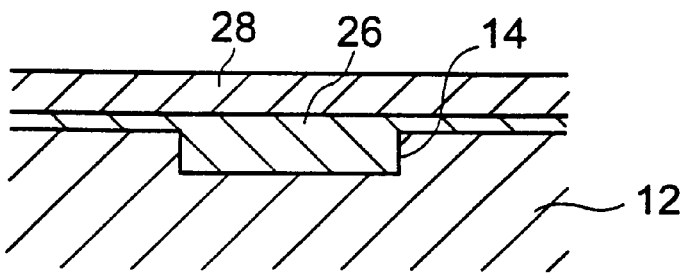
FIG. 4 is a illustrative view showing a method for manufacturing the FIG. 3 embodiment.
Figure 4:
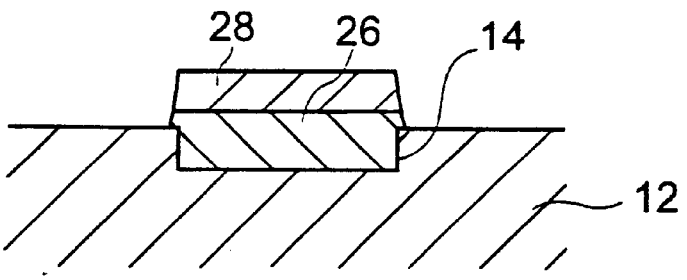
Figure 4:
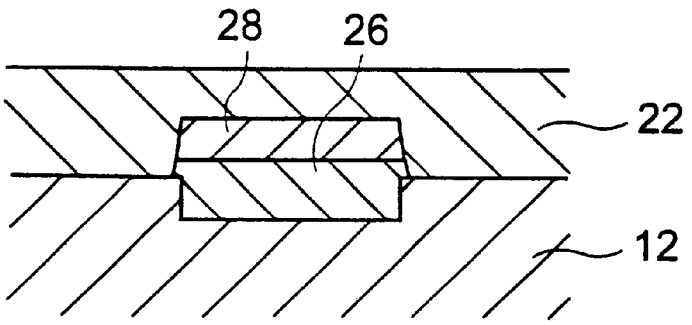
Figure 4:
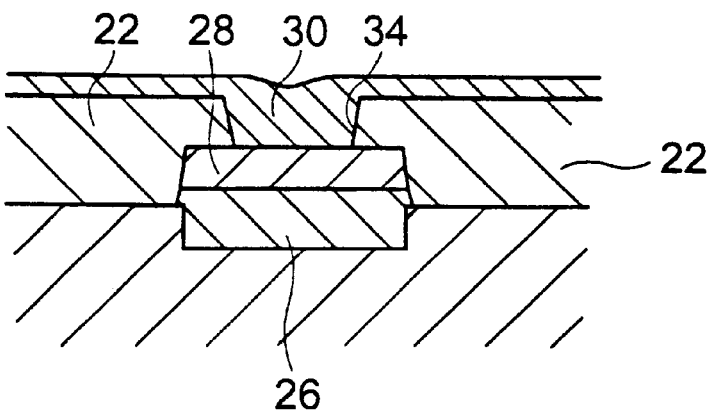
Figure 5:
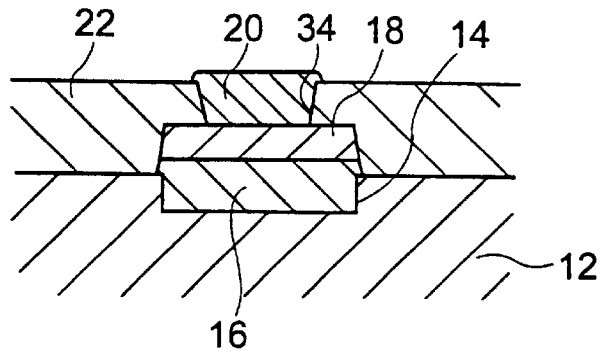
FIG. 5 is an illustrative view showing a modification to the FIG. 3 embodiment.

To fabricate a ferroelectric memory 32, spin coating is conducted to form a first conductive film 26 and film 28 over a first insulation film 12 formed with a hollow 14, as shown in FIG. 4(A). Subsequently, as shown in FIG. 4(B) etching is made (by an RIE technique) on the film 28 and first conductive film 26 to remove unwanted portions. The resulting structure is subjected to a heating process using an RTA apparatus. Then, a second insulation film 22 is formed in a manner covering the first conductive film 26 and film 28, as shown in FIG. 4(C). The film 22 at its top surface is planarized by implementing a CMP (Chemical-Mechanical Polishing) technique. Thereafter, as shown in FIG. 4(D) etching is made (by RIE) on the second insulation film 22 to open a hole 34. Then, a second conductive film 30 is formed over the second insulation film 22 in a manner filling this hole 34 by a spin coating technique (sol-gel technique). The second conductive film 30 and second insulation film 22 are planarized at top surfaces by the CMP (Chemical-Mechanical Polishing) technique. Thereafter, the resulting structure is subjected to heating process using an RTA apparatus to bake and crystallize the lower electrode 16, ferroelectric 18 and upper electrode 20. The planarization process may use etching in place of the CMP technique. In the case of etching, the upper electrode 20 at its top surface is somewhat higher than a top surface of the second insulation film 22, as shown in FIG. 5.

In also this embodiment, it is possible to shorten a time that the film 28 is exposed to a plasma atmosphere during conducting a dry etch process, similarly to the former embodiment. Accordingly, the ferroelectric 18 can be prevented from being deteriorated in characteristic. Meanwhile, the upper electrode 20 is buried in the hole 34, and further planarization is made for the top surfaces of the upper electrode 20 and second insulation film 22. It is therefore possible to form, on the second insulation film 22, an interconnect film in connection with the upper electrode 20.

Figure 6:
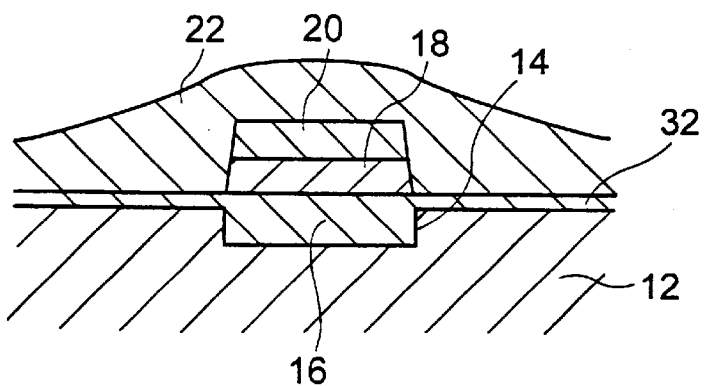
FIG. 6 is an illustrative view showing another embodiment of the present invention.
Figure 6:
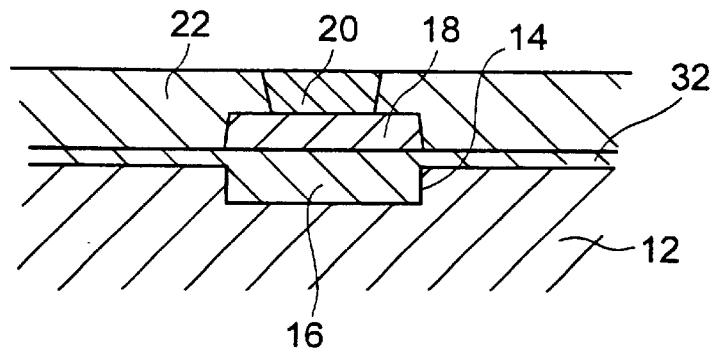
Figure 7:
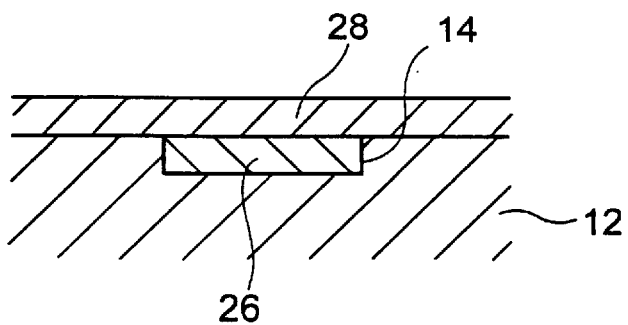
FIG. 7 is an illustrative view showing a state that a film for providing a ferroelectric is formed over a planarized first conductive film and first insulation film.

Incidentally, in the above embodiments, the first conductive film 26 portion extending out of the hollow 14 was removed by etching in the process of FIG. 2(E) or FIG. 4(B). Alternatively, this portion may be utilized for an interconnection 32 without being etched, as shown in FIG. 6(A) or FIG. 6(B).

Figure 8:
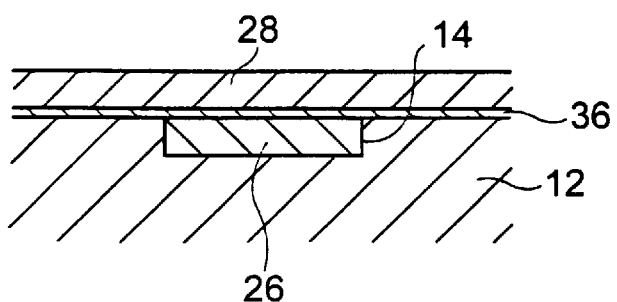
FIG. 8 is an illustrative view showing a state that a film for eliminating surface roughness is formed over a surface of the planarized first conductive film.
Figure 9:
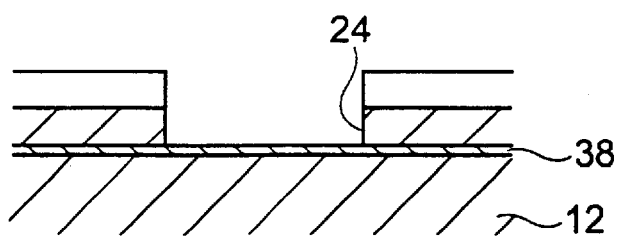
FIG. 9 is an illustrative view showing a state that a film is formed in a first insulation film at a predetermined depth position thereof.

Also, in the process of FIG. 2(C) or FIG. 4(A), the film 28 was formed without planarizing the top surfaces of the first conductive film 26 and first insulation film 12. Alternatively, the film 28 may be formed after planarizing these top surfaces by a CMP (Chemical Mechanical Polishing) technique or etching. In such a case, an etch time can be further shortened because of no necessity of etching the first conductive film 26 portion extending out of the hollow 14 in the later process. Also, in order to eliminate surface roughening in the first conductive film 26 due to a planarization process, a thin film 36 may be formed on a surface of the planarized first conductive film 26 by using a same material as that of the first conductive film 26 as shown in FIG. 8.

Also, a film 38 with a thickness of approximately 1000 angstroms may be formed of silicon nitride (Sin), silicon nitride oxide (SiON) or the like in a predetermined depth position of the first insulation film 12 so that this film 38 can be utilized as an etch stop for forming a hollow 14. The provision of a film 38 makes it possible to planarize a bottom surface of the hollow 14 at a predetermined depth. Accordingly, a lower electrode 16 (FIG. 1, FIG. 3) can be stably formed on the bottom surface. This structure also serves to block the water content contained in the insulation film 12 below the film 38 from reaching the ferroelectric 18 thorough the lower electrode 16. It is therefore possible to prevent the ferroelectric 18 (FIG. 1, FIG. 3) from being deteriorated in characteristic by the water content effect.

Figure 10:
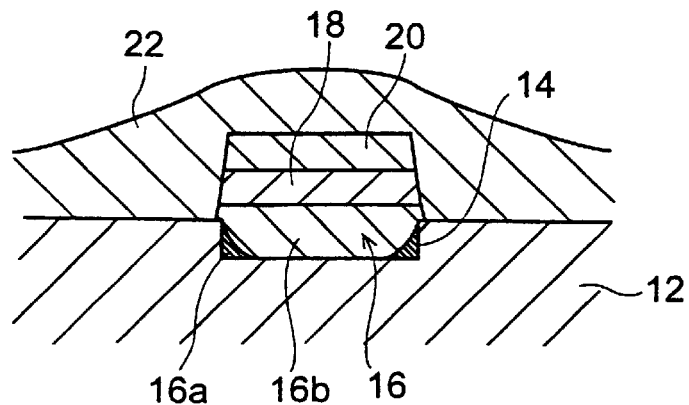
FIG. 10 is an illustrative view showing a state that a first electrode portion is formed at a corner of a hole.
Figure 11:
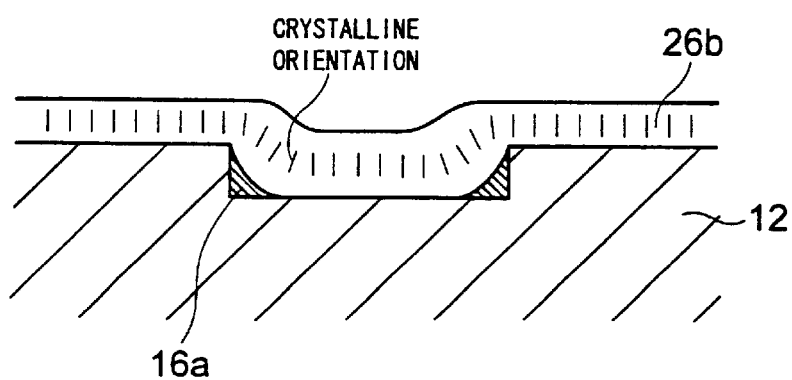
FIG. 11 is an illustrative view showing a state of forming by spattering a first conductive film forming second electrode portion on the first electrode portion.
Figure 12:
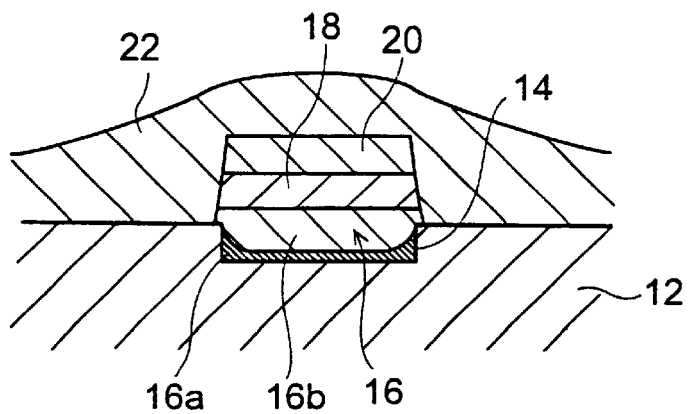
FIG. 12 is an illustrative view showing a state that a first electrode portion is formed on an entire bottom surface of a hole.
Figure 13:
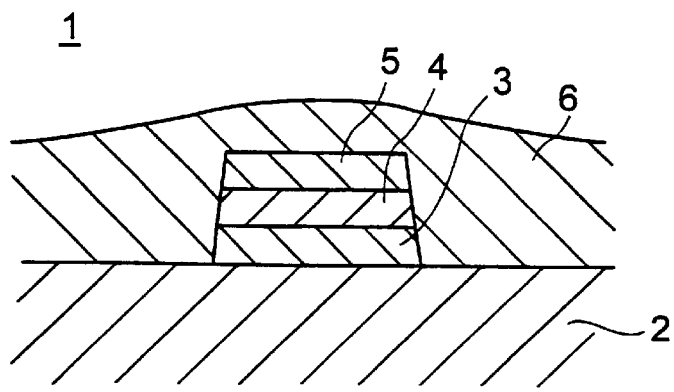
FIG. 13 is an illustrative view showing a conventional ferroelectric memory.
Figure 14:
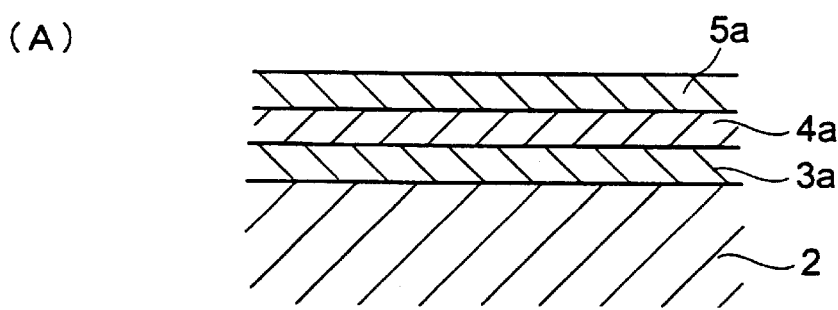
FIG. 14 is an illustrative view showing a method for manufacturing a conventional ferroelectric memory.
Figure 14:
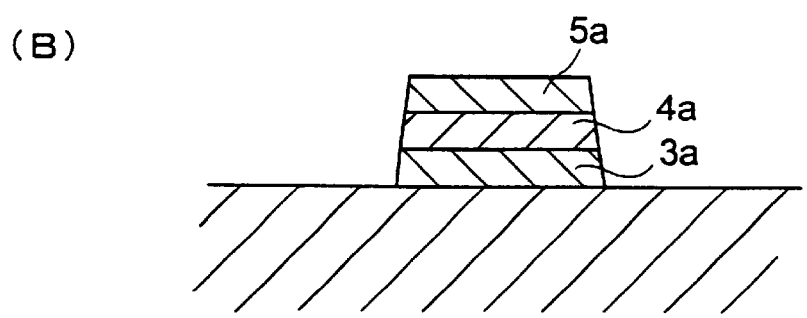

Meanwhile, as shown in FIG. 10, a first electrode portion 16a may be formed at a corner of the hollow 14 by a process including spin coating (e.g. sol-gel technique) so that a second electrode portion 16b can be formed to provide a lower electrode 16. In this case, if the second electrode portion 16b is formed by a process including a spin coat technique (e.g. sol-gel technique), it is possible to decreases an amount of depression to be caused in a top surface center thereof upon baking the lower electrode 16. Meanwhile, if the second electrode portion 16b, or first conductive film 26b, is formed by sputtering, the variation in crystalline orientation is reduced in a top surface of the lower electrode 16, as shown in FIG. 11. This serves to stabilize a crystalline state of the ferroelectric 18 (FIG. 10) to be formed on the lower electrode 16. Furthermore, if the first electrode portion 16a is formed over the entire bottom surface of the hollow 14 as shown in FIG. 12, the second electrode portion 16b can be made thin in thickness by a corresponding amount to the film thickness of the first electrode portion 16a. This reduce the amount of etching to be conductede in the etching process.

Meanwhile, the lower electrode 16 may use ruthenium oxide ($RuO_2$), rhodium oxide ($RhO_2$) or palladium oxide ($PdO_2$) in place of irridium oxide ($IrO_2$). In such a case, a precursor solution is formed containing an ingredient element of ruthenium (Ru), rhodium (Rh), palladium (Pd) or the like.

Although in the above embodiments the lower electrode 16 and upper electrode 20 (FIG. 3, FIG. 5) were formed by the sol-gel technique, they may be formed by another process including spin coat process, such as in an MOD method (organic-metal decomposition).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a ferroelectric memory, comprising:
   (a) forming an insulation film on a semiconductor substrate;
   (b) forming a hollow in a surface of said insulation film;
   (c) forming a lower electrode in said hollow by a sol-gel method;
   (d) forming a ferroelectric film on said insulation film; and
   (e) forming an upper electrode on said ferroelectric film.

2. A manufacturing method according to claim 1, wherein said step (c) includes the following steps of (c1) forming conductive film on a top surface of said insulation film including an inside of said hollow by a spin coating method, and (c2) removing by etching said conductive film at a portion other than said hollow.

3. A manufacturing method according to claim 1, wherein said step (c) includes steps of (c3) forming a first electrode portion at a corner of said hollow by a process including a spin coating method, and (c4) forming a second electrode portion in said first electrode portion.

4. A manufacturing method according to claim 3, wherein said step (c4) is to form said second electrode portion by a process including a spin coating method.

5. A manufacturing method according to claim 3, wherein said step (c4) is to form said second electrode portion by sputtering.

6. A method for manufacturing a ferroelectric memory, comprising:
- (a) forming an insulation film on a semiconductor substrate;
- (b) forming a hollow in a surface of said insulation film;
- (c) forming a lower electrode in said hollow by a sol-gel method;
- (d) forming a ferroelectric film on said insulation film; and
- (e) forming an upper electrode on said ferroelectric film;
- wherein said step (b) includes steps of (b1) forming a film in said insulation film at a predetermined depth position from a top surface thereof, and (b2) forming said hollow by etching said insulation film utilizing film as an etch stop.

7. A method for manufacturing a ferroelectric memory, comprising:
- (a) forming an insulation film on a semiconductor substrate;
- (b) forming a hollow in a surface of said insulation film;
- (c) forming a lower electrode in said hollow by a sol-gel method;
- (d) forming a ferroelectric film on said insulation film;
- (e) forming an upper electrode on said ferroelectric film; and
- (f) planarizing a top surface of said lower electrode, wherein a ferroelectric is formed thereon.

8. A method for manufacturing a ferroelectric memory, comprising:
- (a) forming an insulation film on a semiconductor substrate;
- (b) forming a hollow in a surface of said insulation film;
- (c) forming a lower electrode in said hollow;
- (d) forming a ferroelectric film on said insulation film;
- (e) forming an upper electrode on said ferroelectric film;
- (f) planarizing a top surface of said lower electrode; and
- (g) forming a thin film thereon of a same material as said lower electrode, wherein said ferroelectric is formed thereon.

* * * * *